United States Patent [19]
Shirai et al.

[11] Patent Number: 5,512,193
[45] Date of Patent: Apr. 30, 1996

[54] LOW SATURATED MAGNETIC FIELD BISMUTH-SUBSTITUTED RARE EARTH IRON GARNET SINGLE CRYSTAL AND ITS USE

[75] Inventors: Kazushi Shirai; Kenji Ishikura; Norio Takeda, all of, Tokyo, Japan

[73] Assignee: Mitsubishi Gas Chemical Company, Inc., Tokyo, Japan

[21] Appl. No.: 447,592

[22] Filed: May 23, 1995

[30] Foreign Application Priority Data

May 23, 1994 [JP] Japan .................................. 6-108420

[51] Int. Cl.$^6$ ............................. C30B 29/28; C30B 19/02
[52] U.S. Cl. ..................................... 252/62.57; 252/62.58; 359/324; 359/280; 423/593; 423/594; 423/263
[58] Field of Search .............................. 252/62.57, 62.58; 117/945; 359/324, 280; 423/593, 594, 263

[56] References Cited

FOREIGN PATENT DOCUMENTS

| | | |
|---|---|---|
| 0368483 | 5/1990 | European Pat. Off. . |
| 0510621A2 | 10/1992 | European Pat. Off. . |
| 61020926 | 1/1986 | Japan . |
| 61-20926 | 1/1986 | Japan . |
| 63-301918 | 12/1988 | Japan . |

OTHER PUBLICATIONS

Taketoshi Hibiya et al., "Growth And Magneto-Optic Properties Of Liquid Phase Epitaxial Bi-Substituted Garnet Films For Optical Isolater", 298 N.E.C. Research & Developement, (1986) Jan., No. 1, Tokyo, Japan.

*Primary Examiner*—Melissa Bonner
*Attorney, Agent, or Firm*—Lowe, Price, LeBlanc & Becker

[57] ABSTRACT

A bismuth-substituted rare earth iron garnet single crystal grown on a non-magnetic substrate having a lattice constant of 12.490 Å–12.510 Å by the liquid phase epitaxial method, and represented by a general equation:

$$Gd_xR_yBi_{3-x-y}Fe_{5-z-w}Ga_zAl_wO_{12}$$

where R denotes at least one element selected from the group consisting of yttrium (Y), ytterbium (Yb) and lutetium (Lu), and x, y, z and w are numerical values in the ranges $0.50 \leq y/x \leq 1.35$, $1.40 \leq x+y \leq 1.90$, $0.0 \leq w/z \leq 0.3$ and $0.7 \leq z+w \leq 1.25$. The magneto-optic optical switch or Faraday rotator constituted by the bismuth-constituted rare iron garnet is stably operable in a temperature range of $-20°$ C. to $60°$ C. Because of the saturated magnetic field is 160 (Oe) or less, a magnetic field application device necessary to invert the magnetic field can be miniaturized.

13 Claims, 4 Drawing Sheets

LOW SATURATED MAGNETIC FIELD BISMUTH-SUBSTITUTED RARE EARTH IRON GARNET SINGLE CRYSTAL AND ITS USE

BACKGROUND OF THE INVENTION

1. Field of the Invention

The present invention relates to a bismuth-substituted rare earth iron garnet single crystal used for a Faraday rotator. More particularly, the present invention relates to a low magnetic field bismuth-substituted rare earth iron garnet single crystal suited to a Faraday rotator for an optical switch using a magnet-optic effect, and to a magneto-optical type optical switch formed of the bismuth-substituted rare earth iron garnet single crystal.

2. Description of the Related Prior Art

In recent years, there have been developments in an optical fiber communication system and optical measuring system. One of the optical devices indispensable to such an optical information communication system is an optical switch having a function of exchanging an optical signal or turning on/off the optical signal.

The optical switch which has been put into practice until now is an mechanical type optical switch as disclosed in Japanese Preliminary Publication No. 63-301918 (1988). Its schematic is shown in FIGS. 1A and 1B.

In FIGS. 1A and 1B, reference numerals 1, 2 and 3 denote optical fibers, respectively. Now it is assumed that an optical signal is being transferred from the optical fiber 1 to the optical fiber 2 (FIG. 1A). Next, the optical fiber 1 is mechanically moved to a position opposite to the optical fiber 3 (FIG. 1B). Then, the optical signal which has been transferred from the optical fiber 1 to the optical fiber 2 is now transferred to the optical fiber 3. This is a principle of the mechanical type optical switch.

The structure of the mechanical type optical switch is very simple. In addition, the path (path A) from the optical fiber 1 to the optical fiber 3 is substantially completely separated from the path (path A) from the optical fiber 1 to the optical fiber 3. Therefore, the mechanical type optical switch has a manifest advantage of less crosstalk. However, it is true that the movable portion of the mechanical optical switch has a possibility of a slight change in its position owing to the repetitive operation for a long time. For this reason, where a single-mode optical fiber having a core diameter of about 10 μm, which is generally used as an optical fiber is used, a slight change in position leads to great signal transmission loss. Thus, the mechanical optical switch has a noticeable problem and defect in reliability.

In order to solve the above problem of the mechanical optical switch, an optical switch which requires no mechanical movable portion has been investigated. The optical switch, which requires no mechanical movable portion, is excellent in reliability for a long time.

Various types of optical switches have been proposed. Among them, particularly, a magneto-optic type of optical switch using the Faraday effect has attracted considerable attention.

The Faraday effect is a kind of the magneto-optic effect. The Faraday effect means a phenomenon that the polarized plane of light having permeated through a material exhibiting the Faraday effect i.e., Faraday element (or Faraday rotator) rotates. The rotating angle of the polarized plane is proportional to the strength of magnetization in the Faraday element. Such a phenomenon is shown in FIG. 2.

In FIG. 2, the Faraday rotating angle of the Faraday rotator with no external magnetic field (strength) applied is located at zero [0] or an origin o. As the external magnetic field applied is strengthened gradually, the absolute value of the Faraday rotating angle ($\Theta_F$ or $-\Theta_F$, generally, plus in a clockwise rotation and minus in a counterclockwise rotation) increases gradually through path a or path d (path o→a→b or path o→d→e). When the external magnetic field strength reaches a certain strength (Hs or -Hs), the Faraday rotating angle becomes a saturated value (saturated magnetic field: b or e point). Even when the external magnetic field strength further increases, since the Faraday rotating angle has already been saturated, it only shifts from b to c or from e to f with no change in the absolute value.

Next, as the external magnetic field strength is decreased gradually, the rotating angle follows a reverse path, i.e., c→b→a→o or f→e→d→o and returns to the origin o). The basic operation of the magneto-optic type optical switch is to generate the magnetic field larger than the saturated points b and e in FIG. 2 in a magnetic field generating device so that the magnetic characteristic status of the Faraday rotator is changed or the direction of magnetization is reversed.

The basic structure of the optical switch using the Faraday rotator formed of e.g., bismuth-substituted rare earth iron garnet single crystal is such as shown in FIG. 3. In FIG. 4, reference numeral 4 designates a polarizer made of e.g., futile; 5 a Faraday rotator; 6 a polarization separation element of e.g., rutile; and 7 a magnetic field generating device (made of an electromagnet) for generating a magnetic field enough to saturate the Faraday rotator magnetically, i.e., the magnetic field larger than saturated magnetic field.

In FIG. 3, the light having permeated through the polarizer 4 becomes a linear polarized light which is incident on the Faraday rotator. The polarization plane of the light incident on the Faraday rotator rotates there. As shown in FIG. 1, whether the rotating direction of the polarization plane is clockwise (plus) or counterclockwise (minus) depends on the direction of the magnetic field applied to the Faraday rotator. When the rotating direction of the polarization plane is changed, the optical path of the light which has permeated through the polarized light separating element 7 is also changed. Thus, the optical signal transmission path can be switched.

In such a structure, when the saturated magnetic field of the Faraday rotator is large, in order to generate a magnetic field enough to saturate the magnetization of the Faraday rotator, a large-scaled magnetic field generating device is required and a large amount of current must be passed. This leads to a disadvantage of an increase in the heat generated in coils. For this reason, in order to actualize and generalize the optical switch using the Faraday effect, the saturated magnetic field of the Faraday rotator must be decreased so that power consumption and size of the magnetic field generating device can be decreased.

As a material for a high-performance Faraday rotator which can be magnetically saturated by a relatively small magnetic field and has great magneto-optic effect, bismuth-substituted rare earth iron garnet single crystal represented by a chemical equation $(TbBi)_3(FeGaAl)_5O_{12}$ or $(GdBi)_3(FeGaAl)_5O_{12}$ has been proposed (Japanese Preliminary Publication No. Sho 61-20928).

Generally, the chemical composition of the bismuth-substituted rare earth iron garnet single crystal can be expressed by $(LBi)_3(FeM)_5O_{12}$ (where L denotes yttrium (Y) or rare earth element, and M denotes an element such as Al, Ga, In, Si or Sc). It is well known that the saturated magnetic field of the bismuth-substituted rare earth iron garnet single crystal depends on the kinds and concentrations of the constituent elements. For example, terbium Tb and gadolinium Gd selected as a rare earth element and substitution of aluminum Al or gadolinium Gd substituted for part of iron can reduce the saturated magnetic field (Japanese Preliminary Publication No. 61-20926).

The inventors of this application were interested in the magneto-optic effect of the bismuth-substituted rare earth iron garnet single crystal represented by a chemical equation $(TbBi)_3(FeGaAl)_5O_{12}$ $(GdBi)_3(FeGaAl)_5O_{12}$ now presented, and first made detailed fundamental experiments in order to develop an optical switch using the Faraday effect. The result of the fundamental experiment thus obtained was contrary to expectations of the inventors. Namely, the bismuth-substituted rare earth iron garnet single crystal having a low saturated magnetic field involved two critical technical difficulties or problems. The first is a problems relative to inversion of the bismuth-substituted rare earth iron garnet single crystal having a low saturated magnetic field, and the second is a problem due to the temperature characteristic of this crystal.

Generally, in order to invert the magnetization direction of the common bismuth-substituted rare earth iron garnet single crystal, it has only to apply a magnetic field slightly larger than the saturated magnetic field. Sometimes, the bismuth-substituted rare earth iron garnet single crystal having a low saturated magnetic field exhibits a phenomenon that the magnetization will not be inverted even when the magnetic field approximately equal to the saturated magnetic field is applied.

In order to clarify the reason why the magnetization of the bismuth-substituted rare earth iron garnet single crystal having a low saturated magnetic field is not inverted, the inventors of this application made various experiments eagerly. As a result, it was found that this is attributed to the magnetic hysteresis. An explanation will be given of the magnetic hysteresis of the bismuth-substituted rare earth iron garnet single crystal.

The magnetization characteristic for an external magnetic field of the common bismuth-substituted rare earth iron garnet single crystal having a relatively large saturated magnetic field, i.e., the relation between the external magnetic field strength and the Faraday rotating angle is such as shown in FIG. 2.

On the other hand, in the bismuth-substituted rare earth iron garnet single crystal having a low saturated magnetic field, the relation between the external magnetic field strength and the Faraday rotating angle draws a hysteresis loop such as a path o→a→b→c→b→b'→a→o as shown in FIG. 4. Specifically, the path (o→a→b→c) when the strength of the external magnetic field is increased is different from that (c→b→b'→a→o) when it is decreased.

In FIG. 4, when the magnetic field at points b and e and magnetic field at points b' and e' resulting from the hysteresis of the magnetization characteristic are defined as a saturated magnetic field Hs and a nucleus generating magnetic field Hn, respectively, the difference between the saturated magnetic field Hs and the nucleus creation magnetic field Hn represents the size of the hysteresis.

For simplicity of explanation, the saturated magnetic field Hs at point b is represented by $Hs_1$; the nucleus creation magnetic field at point b' is represented by $Hn_1$; the saturated magnetic field at point e is represented by $Hs_2$; and the nucleus creation magnetic field at point e' is represented by $Hn_2$.

Now, when the hysteresis of the bismuth-substituted rare earth iron garnet single crystal increases and the nucleus creation magnetic field Hn approaches the origin o, the state once magnetically saturated will be held until the external magnetic field becomes substantially zero. When the hysteresis of the bismuth-substituted rare earth iron garnet single crystal further increases, sometimes the nucleus creation magnetic field $Hn_1$ goes over the origin to intrude into the minus side (FIG. 5), and in other times, the nucleus creation magnetic field $Hn_1$ becomes larger than the saturated magnetic field $Hs_2$ (in comparison in their absolute values) or inversely the nucleus creation magnetic field $Hn_2$ becomes larger than the saturated magnetic field $Hn_2$ to draw a square hysteresis curve (FIG. 6). Namely, once saturated, such a square loop will be only drawn.

As is apparent from the description hitherto made, the strength (hereinafter referred to as "inverted magnetic field") of the external magnetic field necessary to invert the magnetization of the bismuth-substituted rare earth iron garnet single crystal (i.e., invert the sign of the Faraday rotating angle) is determined by the saturated magnetic field when the saturated magnetic field is stronger than the nucleus creation magnetic field, or the nucleus creation magnetic field when the nucleus creation magnetic field is stronger than the saturated magnetic field.

For this reason, when the Faraday rotator having a large hysteresis is to be magnetically saturated, correspondingly, the inverted magnetic field must be much stronger than the saturated magnetic field. In order to implement this, a large-scale magnetic field device is required, thereby requiring large electric power. This provides a problem of heat generation in coils due to a current.

As a method of decreasing the magnetic hysteresis of the bismuth-substituted rare earth iron garnet single crystal, Japanese Patent Application No. Hei 5-249523 proposes to bring a permanent magnet into contact with a part of the bismuth-substituted rare earth iron garnet single crystal. However, when an optical switch is to be actually formed using the proposed method, addition of the permanent magnet necessarily requires the Faraday rotator having a large size and hence a large-sized magnetic field application device. This makes it difficult to reduce the size of the optical switch. Such a disadvantage will be explained.

When the permanent magnet is used in intimate contact with the one end of the bismuth-substituted rare earth iron garnet single crystal, the area through which light actually passes must be apart by several millimeters from the area with which the permanent magnet is kept into contact. If the area through which light actually passes is near to the permanent magnet, the magnetic field generated by the permanent magnet makes it impossible to switch the direction of magnetization, i.e. effect the switching function.

Thus, even when the means for bringing the permanent magnet into contact with the one end of the bismuth-substituted rare earth iron garnet single crystal to reduce the magnetic hysteresis is applied to the optical switch, the size of the optical switch cannot be reduced.

As a result, the inverted magnetic field of the bismuth-substituted rare earth iron garnet single crystal used for a magneto-optic switch is desired to have a smaller hysteresis and lower saturated magnetic field. Concretely, the inverted magnetic field is desired to be 160 (Oe) or lower.

Another problem when the bismuth-substituted rare earth iron garnet single crystal is applied to the Faraday rotator for the magneto-optic optical switch is a magnetic compensation temperature.

At a certain temperature Tn, the sign of the Faraday rotating angle which is added to recognize the direction (right or left) of the polarized plane of signal light is inverted. This temperature Tn is referred to as the magnetic compensation temperature. Application of the bismuth-substituted rare earth iron garnet single crystal having the magnetic compensation temperature to the Faraday rotator for the magneto-optic optical switch makes the operation of the optical switch unstable in the neighborhood of the magnetic compensation temperature.

The environment where the optical switch is installed may be changed in accordance with its using manner. For example, where a plant measuring system is installed outdoors, the optical switch must stably operate in a temperature range from −20° C. to 60° C. The magnetic compensation temperature of the bismuth-substituted rare earth iron garnet single crystal used for the magneto-optic type optical switch must be absolutely −20° C. or lower. As an actual problem, in view of the reliability of the magneto-optic optical switch, the phenomenon that the magneto-optic type optical switch may become unstable under the temperature condition in the neighborhood of the magnetic compensation temperature must be absolutely avoided. Therefore, the magnetic compensation temperature of the bismuth-substituted rare earth iron garnet single crystal must be set for −30° C. or lower which is further lower than the lower-limit operation temperature of the optical switch.

Now, the bismuth-substituted rare earth iron garnet single crystal represented by chemical equations $(TbBi)_3(FeGaAl)_5O_{12}$ and $(GdBi)_3(FeGaAl)_5O_{12}$, which has been proposed in Japanese Patent Preliminary Publication No. Sho 61-20926 as a material for the high performance Faraday rotator saturated magnetically by a relatively weak magnetic field and having a great magneto-optic effect, is applied to the indispensable requirements for the Faraday rotator for the magneto-optic type optical switch described above, i.e., (1) the inverted magnetic field is low and (2) the magnetic temperature is −30° C. or lower. The result is as follows.

The bismuth-substituted rare earth iron garnet single crystal represented by the chemical equation $(TbBi)_3(FeGaAl)_5O_{12}$ has a magnetic compensation temperature of −50° C. or lower which satisfies the requirement of −30° C. or lower, but has large hysteresis and hence a very strong inverted magnetic field of 300 (Oe) or higher. As a result, the above crystal cannot satisfy the performance required for the Faraday rotator for the magneto-optic type optical switch.

Further, the inverted magnetic field of the bismuth-substituted rare earth iron garnet single crystal represented by the chemical equation $(GdBi)_3(FeGaAl)_5O_{12}$ having the composition providing a magnetic compensation temperature of −30° C. or lower, e.g., a chemical composition $(Gd_{1.83}Bi_{1.17})(Fe_{4.31}Ga_{0.07}Al_{0.62})O_{12}$ is 180 (Oe) within a temperature range of −20° to 60° C. which does not satisfy the performance of the inverted magnetic field of 160 (Oe) required for the magneto-optic type optical switch.

Inversely, an example of the composition $(Gd_{2.03}Bi_{0.97})(Fe_{4.46}Ga_{0.11}Al_{0.43})O_{12}$ providing an inverted magnetic field of 160 (Oe) or lower gives a magnetic compensation temperature of −8° C. which does not satisfy the performance of −30° C. required for the Faraday rotator for the magneto-optic type optical switch. As a result, in the magneto-optic type optical switch with the Faraday rotator formed of the bismuth-substituted rare earth iron garnet single crystal, the magnetic field generation device which can generate a magnetic filed of 160 (Oe) or higher must be used. This cannot meet the social demand of miniaturization of the optical switch.

The magneto-optic switch is excellent in reliability because it has no mechanical movable portion, but a large-scale magnetic field generating device is required. Its miniaturization is an important technical problem. In order to further reduce the size of the magnetic field generating device, the bismuth-substituted rare earth iron garnet single crystal having a magnetic compensation temperature of −30° C. or lower but providing an inverted magnetic field of 160 (Oe) or lower must be developed.

As described above in detail, the well-known bismuth-substituted rare earth iron garnet single crystal with a low saturated magnetic field involves important technical problems in the magnetic compensation temperature and inverted magnetic field. This single crystal is not a material suitable for the Faraday rotator for the optical switch.

In order to meet the social demand of miniaturizing the magneto-optic type optical switch, a new bismuth-substituted rare earth iron garnet single crystal suitable to the Faraday rotator for the optical switch must be developed.

SUMMARY OF THE INVENTION

An object of the present invention is to provide a magneto-optic type optical switch which is small in size and light in weight and can operate within a temperature range of −20° C. to 60° C..

In order to meet the social demand of miniaturizing the magneto-optic type optical switch, and search the possibility of developing a new bismuth-substituted rare earth iron garnet single crystal for a magneto-optic type optical switch, the inventors of the present invention made various fundamental and searching experiments. As a result, the inventors have found the possibility in the bismuth-substituted rare earth iron garnet single crystal grown and fabricated by a liquid-phase epitaxial (LPE) and represented by a general equation $(GdRBi)_3(FeGaAl)_5O_{12}$.

On the basis of the fundamental knowledge thus obtained, the inventors of the present invention have made various fundamental and developmental experiments in order to develop a higher performance bismuth-substituted rare earth iron garnet single crystal for a magneto-optic type optical switch. As a result, the inventors of the present invention have acquired the knowledge that the bismuth-substituted rare earth iron garnet single crystal grown on a non-magnetic substrate having a lattice constant of 12.490 Å–12.510 Å by the liquid phase epitaxial method, and represented by a general equation:

$$Gd_xR_yBi_{3-x-y}Fe_{5-z-w}Ga_zAl_wO_{12}$$

where R denotes at least one element selected from the group consisting of yttrium (Y), ytterbium (Yb) and lutetium (Lu), and x, y, z and w are numerical values in the ranges $0.50 \leq y/x \leq 1.35$, $1.40 \leq x+y \leq 1.90$, $0.0 \leq w/z \leq 0.3$, $0.0 \leq z+w \leq 1.25$.

The inventors made further preliminary experiments to complete the present invention.

The bismuth-substituted rare earth iron garnet single crystal represented by a general equation $(GdRBi)_3(FeGaAl)_5O_{12}$ according to the present invention is easy to handle and can be grown on a non-magnetic garnet substrate such as e.g., a $Gd_3Ga_5O_{12}$ substrate having a lattice constant of 12.383 Å [GGG substrate], a $Sm_3Ga_5O_{12}$ substrate having a lattice constant of 12.405 Å [SGG substrate], $Nd_3Ga_5O_{12}$ substrate [NGG substrate], or a $(CaGd)_3(ZrMgGa)_5O_{12}$ substrate [SGGG substrate] by the known liquid phase epitaxial (LPE) method with excellent mass productivity.

However, if the $Gd_3Ga_5O_{12}$ substrate having a lattice constant of 12.383 Å [GGG substrate] or the $Sm_3Ga_5O_{12}$ substrate having a lattice constant of 12.405 Å [SGG substrate] is selected as the non-magnetic garnet substrate, because of the small lattice constant, a limitation or boundary occurs in the replacement amount of bismuth having a large lattice constant. With a small amount of bismuth replacement, the Faraday rotating coefficient of the bismuth-substituted rare earth iron garnet single crystal represented by the general equation $(GdRBi)_3(FeGaAl)_5O_{12}$ decreases so that the film thickness necessary for the Faraday rotator increases. As a result, the bismuth-substituted rare earth iron garnet single crystal suitable to attain the object of the present invention of miniaturizing the magneto-optic type optical magnetic switch, and represented by a general equation:

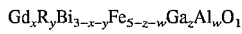

where R denotes at least one element selected from the group consisting of yttrium (Y), ytterbium (Yb) and lutetium (Lu), and x, y, z and w are numerical values in the ranges 0.50≦y/x≦1.35, 1.40≦x+y≦1.90, 0.0≦w/z≦0.3, 0.0≦z+w≦1.25 cannot be obtained.

Therefore, in putting the present invention into practice, from the viewpoint of lattice alignment, as the non-magnetic garnet substrate, the $(CaGd)_3(ZrMgGa)_5O_{12}$ substrate having a lattice constant of 12.490 Å to 12.510 AÅ [SGGG substrate] or the $Nd_3Ga_5O_{12}$ substrate having a lattice constant of 12.509 Å [NGG substrate] must be selected.

The epitaxial growth temperature when the present invention is put into practice is not particularly limited, but may be suitably selected in accordance with the composition of a melt within a range of 730° C. to 850° C. which has been generally adopted in the growth of the bismuth-substituted rare earth iron garnet single crystal.

In putting the present invention into practice, the non-magnetic garnet substrate for creating the GdRBiFeGaAl garnet thin film is not required to be removed; rather, if the GdRBiFeGaAl garnet single crustal film is as thin as several tens μm, the substrate is desired to be left as a support in view of the strength. On the other hand, if the GdRBiFeGaAl garnet film is as thick as several hundreds μm, the substrate is not required as the support in view of the strength. From the viewpoint of miniaturization, the substrate is desired to be removed by grinding.

In putting the present invention into practice, the rare earth element should be a combination of gadolinium Gd and R (R is at least one element selected from the group consisting of yttrium Y, ytterbium Yb and lutetium Lu. The rare earth elements other than yttrium Y, ytterbium Yb and lutetium Lu, are not preferable as a rare earth element to be combined with gadolinium Gd since the maximum value of the inverted magnetic field in the temperature range of −20° C. to 60° C. exceeds the target value 160 (Oe).

In putting the present invention into practice, the value of y/x in the chemical composition of the GdRBiFeGaAl garnet single crystal, i.e., a general equation:

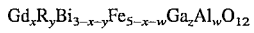

where R denotes at least one element selected from the group consisting of yttrium (Y), ytterbium (Yb) and lutetium (Lu), should be selected in a range of 0.50 to 1.35, more preferably, 0.85 to 1.15. The value of y/x not larger than 0.50, which leads to a magnetic compensation temperature higher than −30° C., is not preferable. The value of y/x not smaller than 1.35, which leads to the maximum value of the inverted magnetic field within a temperature range of −20° to 60° C. exceeding 160 (Oe), is not preferable.

The value of x+y should be selected within a range of 1.40 to 1.90, more preferably 1.50 to 1.80. The value of x+y not larger than 1.40, i.e., bismuth replacement amount 3−x−y not larger than 1.60 leads to deposition of minute crystal in a melt during the growth of single crystal, thereby making it impossible to grow the single crystal. The value of x+y not larger than 1.90, i.e., bismuth replacement amount 3−x−y not larger than 1.10 leads to impossibleness of lattice alignment with the substrate, thereby making it difficult to grow the single crystal.

In putting the present invention into practice, as an element for replacement of a part of an iron element, aluminum Al and gallium Ga are preferable. Aluminum Al and gallium Ga serve to reduce the saturated magnetic field. If anything, gallium Ga is more efficient than aluminum Al in reducing the saturated magnetic field. Therefore, in putting the present invention into practice, only gallium Ga is used alone or in combination with aluminum Al so that the ratio w/z of gallium Ga to aluminum Al is within a range of 0 to 0.30, more preferably 0 to 0.20. The ratio w/z of aluminum Al to gallium Ga not smaller than 0.30, which provides the maximum value of the inverted magnetic field within a temperature range of −20° to 60° C. exceeding 160 (Oe), is not preferable.

In putting the present invention into practice, the replacement amount of an iron element, i.e., sum z+w of aluminum Al and gallium Ga should be selected in a range of 0.70 to 1.25, more preferably 0.85 to 1.1. The value of z+w not larger than 0.7, which leads to the saturated magnetic field within a temperature range of −20° C. to 60° C. (i.e., maximum value of the inverted magnetic field) not smaller than 160 (Oe), is not preferable.

DESCRIPTION OF THE PREFERRED EMBODIMENTS

A concrete and detailed explanation will be given of embodiments of the present invention and their advantages.

But, these embodiments do not intend to limit the manner of realizing the present invention and the scope thereof.

Embodiment 1

In a platinum crucible having a capacity of 1000 ml, lead oxide (PbO, 4N) of 1660 g, bismuth oxide ($Bi_2O_3$, 4N) of 1160, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 6.4 g and gallium oxide ($Ga_2O_3$, 3N) of 39.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 767° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 μm, a lattice constant of 12.497±0.002 Å was brought into contact with the surface of the melt. While the temperature of the melt is maintained at 767° C., the epitaxial growth was performed for three hours to provide a bismuth-substituted rare earth iron garnet single crystal having a composition of $Gd_{0.81}Y_{0.81}Bi_{1.38}Fe_{4.00}Ga_{1.00}O_{12}$ and a thickness of 72 μm.

Figure 1A:
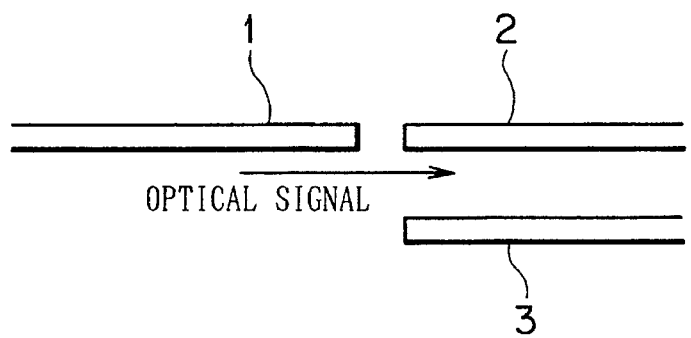
FIGS. 1A and 1B are schematic diagrams each showing one example of a mechanical optical switch.
Figure 1B:
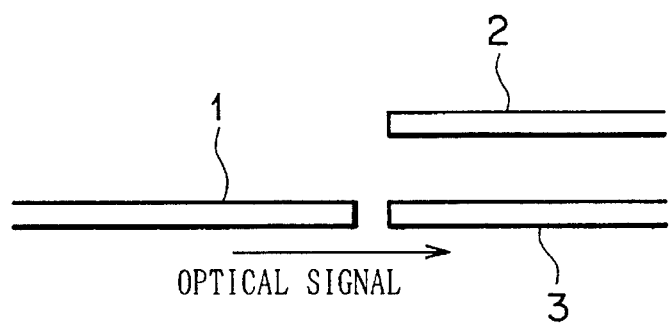
Figure 2:
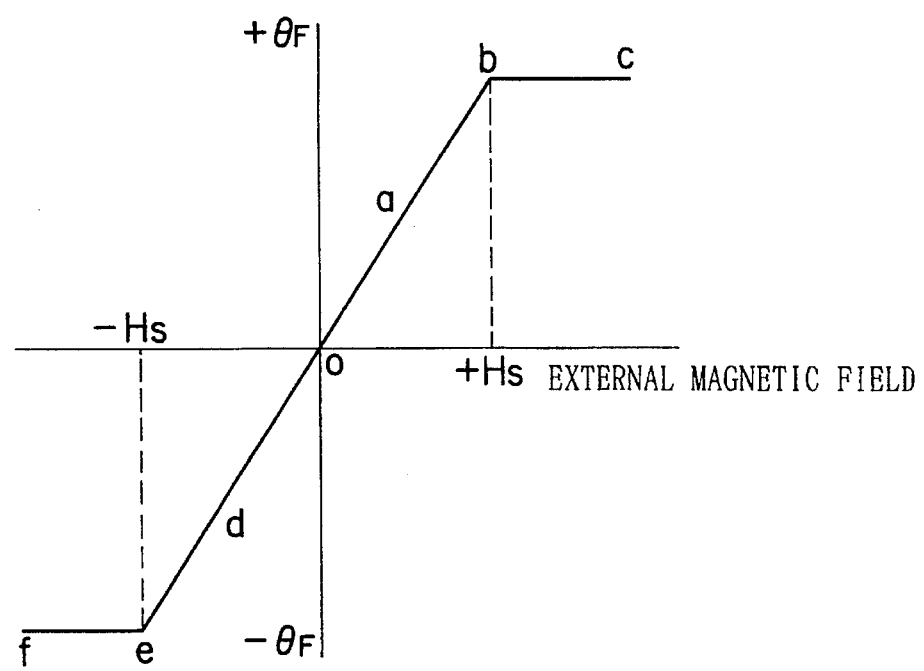
FIG. 2 is a graph showing the dependency of the Faraday rotating angle of the bismuth-substituted rare earth iron garnet single crystal on an applied magnetic field.
Figure 3:
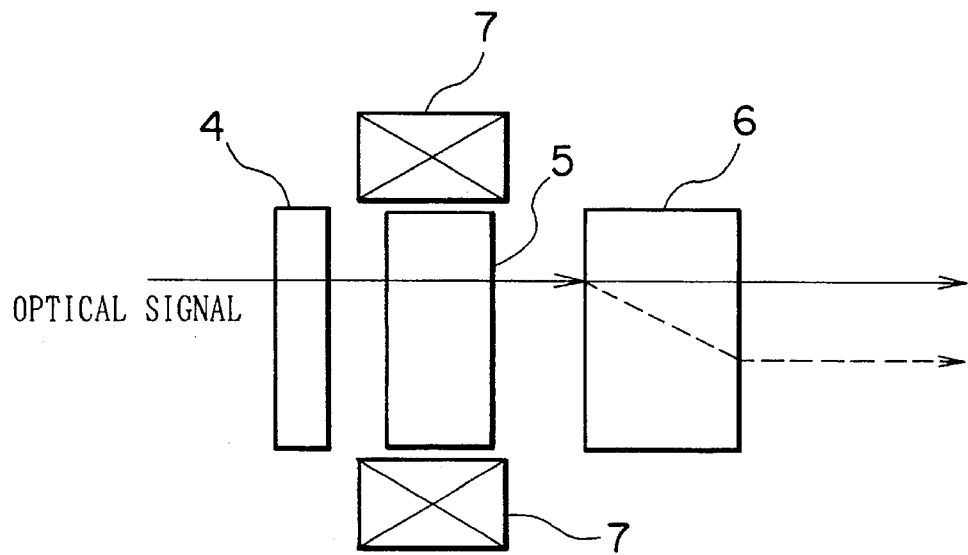
FIG. 3 is a schematic diagram showing the theory of a magneto-optic optical switch.
Figure 4:
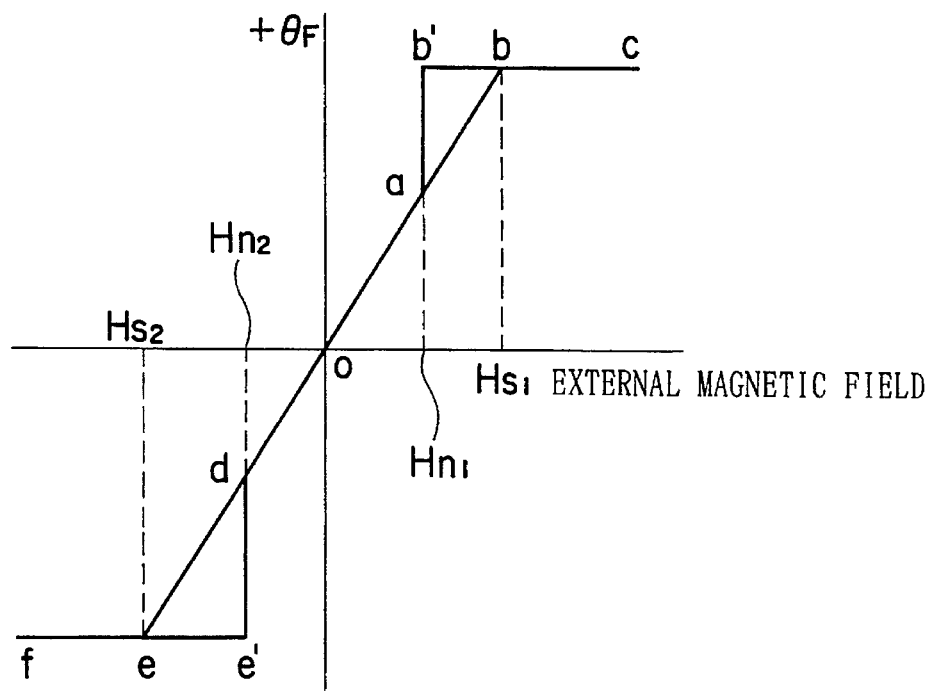
FIG. 4 is a graph showing one example of the magnetic characteristic of the bismuth-substituted rare earth iron garnet single crystal exhibiting hysteresis.
Figure 5:
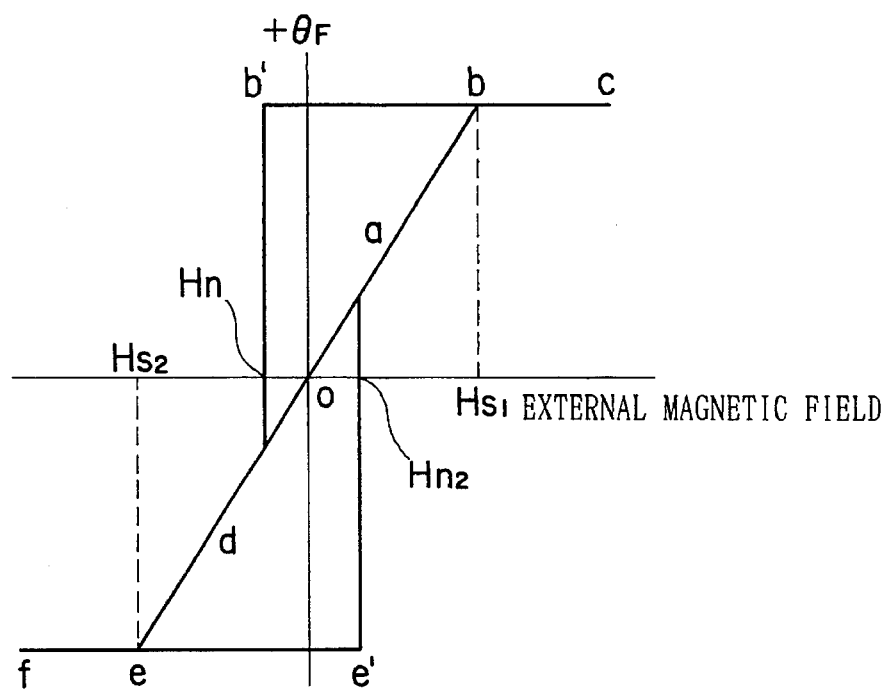
FIG. 5 is a graph showing one example of the magnetic characteristic of the bismuth-substituted rare earth iron garnet single crystal exhibiting large hysteresis.
Figure 6:
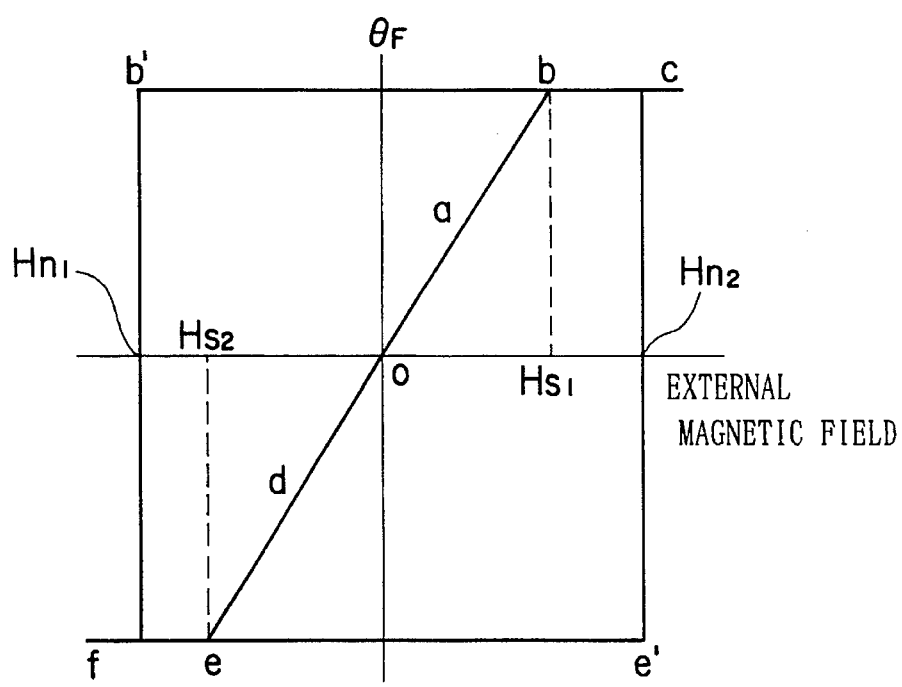
FIG. 6 is a graph showing one example of the magnetic characteristic of the bismuth-substituted rare earth iron garnet single crystal exhibiting very large hysteresis.
Figure 7:
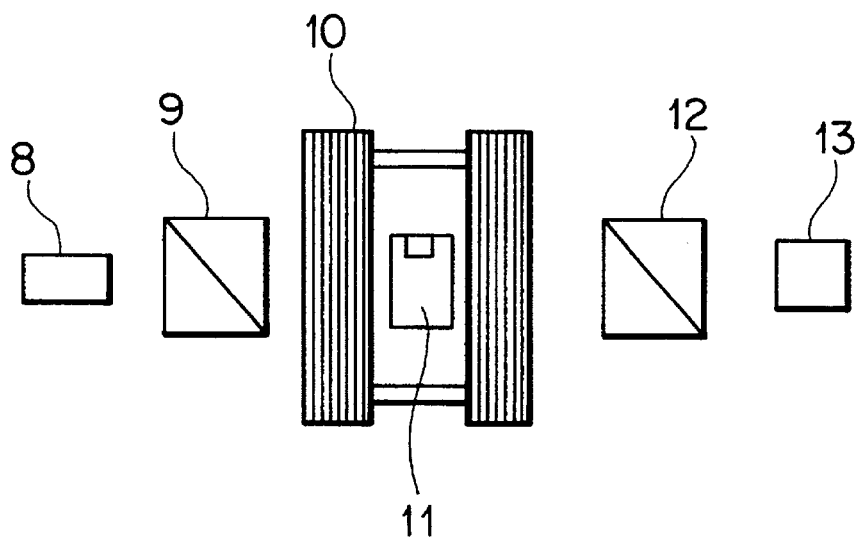
FIG. 7 is a schematic diagram showing the device for measuring temperature changes of the magnetic characteristic.

Next, the temperature dependency of the saturated magnetic field and nucleus creation magnetic field of the bismuth-substituted rare earth iron garnet single crystal were measured. The schematic of the measuring method is shown in FIG. 7. In FIG. 7, reference numeral 8 denotes a semiconductor laser (wavelength 0.785 μm) available from NIHON KAGAKU ENGINEERING Co. Ltd.; 9 a polarizer formed of a Clan-Thompson prism; 10 a Helmholz coil for magnetic field application available from NIHON KAGAKU ENGINEERING Co. Ltd.; 11 a sample heating/cooling device available from SURUGASEIKI Co. Ltd.; 12 an analyzer formed of a Clan-Thompson prism; and 13 a power meter available from ANRITU Co. Ltd. Incidentally, the lowest temperature which can attained by the sample heating/cooling device is −40° C..

First, the bismuth-substituted rare earth iron garnet single crystal inserted in the heating/cooling device 11 is set in the Helmholz coil 10. The semiconductor laser light having a wavelength of 0.786 μm is projected onto the bismuth rare earth garnet single crystal through the polarizer 9. The laser light having a wavelength of 0.786 μm having permeated through the bismuth-substituted rare earth iron garnet single crystal is detected by the power meter 13 through the analyzer 12. In this measuring system, when the analyzer 12 is rotated, the optical power strength to be detected by the power meter 13 varies. From the relation between the optical power strength and the rotating angle of the analyzer 12, the rotating angle of the laser light with a wavelength of 0.786 μm having permeated through the bismuth-substituted rare earth iron garnet single crystal can be obtained.

The relation between the Helmholz coil and the Faraday rotating angle is as shown in FIGS. 2 to 5. Therefore, the saturated magnetic field and nucleus creation magnetic field of the bismuth-substituted rare earth iron garnet single crystal are measured.

Figure 8:
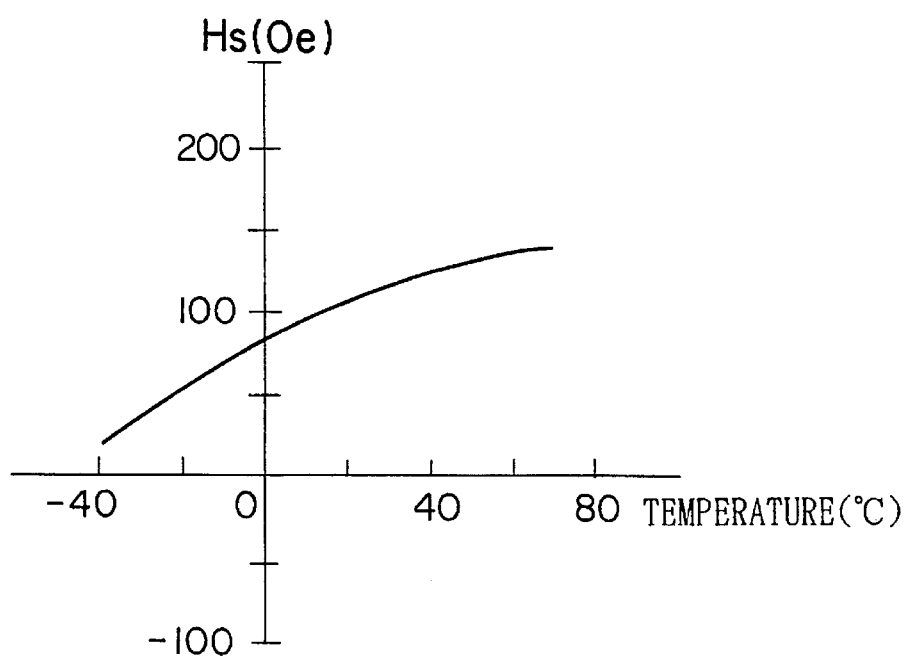
FIG. 8 is a graph showing the dependency of the saturated magnetic filed on temperatures.

With the $Gd_{0.81}Y_{0.81}Bi_{1.38}Fe_{4.00}Ga_{1.00}O_{12}$ single crystal obtained in this embodiment, the maximum value of the saturated magnetic field was 134 (Oe) within a temperature range of −20° C. to 60°, the maximum value of the nucleus creation magnetic field was 108 (Oe). Namely, the maximum value of the saturated magnetic field in the inverted magnetic field was 134 (Oe) in the temperature range of −20° C. to 60° C. The magnetic compensation temperature was −40° C. or lower. For reference, the temperature dependency of the saturated magnetic field is shown in FIG. 8.

Analysis of the composition was carried out in the following procedure. After the substrate of the bismuth-substituted rare earth iron garnet single crystal film is removed by grinding, the film is dissolved into hydrochloric acid. The hydrochloric acid solution thus obtained was subjected to ICP light emission spectroscopic analysis.

Embodiment 2

In a platinum crucible having a capacity of 1000 ml, lead oxide (PbO, 4N) of 1660 g, bismuth oxide ($Bi_2O_3$, 4N) of 1160, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 8.3 g, gallium oxide ($Ga_2O_3$, 3N) of 45 g have been prepared. It was set at a predetermined position of a precise longitudinal tubular electric furnace. These compounds were heated and molten at 1000° C., and sufficiently stirred to be mixed uniformly. Then, the melt thus obtained was cooled to 789° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 μm, a lattice constant of 12.497±0.002 Å was brought into contact with the surface of the melt. While the temperature of the melt is maintained at 789° C., the epitaxial growth was performed for three hours to provide a bismuth-substituted rare earth iron garnet single crystal having a composition of $Gd_{0.65}Y_{0.85}Bi_{1.50}Fe_{3.85}Ga_{1.15}O_{12}$ and a thickness of 82 μm.

The dependency of the Faraday rotating angle on the external magnetic field was measured by the procedure in Embodiment 1. With the $Gd_{0.65}Y_{0.85}Bi_{1.50}Fe_{3.85}Ga_{1.15}O_{12}$ single crystal obtained in this embodiment, the maximum value of the inverted magnetic field was 127 (Oe) within a temperature range of −20° C. to 60°. The magnetic compensation temperature was −32° C.

Embodiment 3

In a platinum crucible having a capacity of 1000 ml, lead oxide (PbO, 4N) of 2453 g, bismuth oxide ($Bi_2O_3$, 4N) of 1778 g, ferric oxide ($Fe_2O_3$, 4N) of 268 g, boron oxide ($B_2O_3$, 5N) of 113 g, gadolnium oxide ($Gd_2O_3$, 3N) of 18.7 g, yttrium oxide ($Y_2O_3$, 3N) of 6.4 g, gallium oxide ($Ga_2O_3$, 3N) of 42 g have been prepared. It was set at a predetermined position of a precise longitudinal tubular electric furnace. These compounds were heated and molten at 1000° C., and sufficiently stirred to be mixed uniformly. Then, the melt thus obtained was cooled to 780° C. to grow a bismuth-substituted rare earth iron garnet single crystal.

According to the ordinary technique, the one side of a (111) garnet single crystal [$Nd_3Ga_5, O_{12}$] substrate having a thickness of 400 μm, a lattice constant of 12.509 Å was brought into contact with the surface of the melt. While the temperature of the melt is maintained at 780° C., the epitaxial growth was performed for three hours to provide a bismuth-substituted rare earth iron garnet single crystal having a composition of $Gd_{1.17}Y_{0.67}Bi_{1.16}Fe_{4.24}Ga_{0.76}O_{12}$ and a thickness of 69 μm.

The dependency of the Faraday rotating angle on the external magnetic field was measured by the procedure in Embodiment 1. With the $Gd_{1.17}Y_{0.67}Bi_{1.16}Fe_{4.24}Ga_{0.76}O_{12}$ single crystal obtained in this embodiment, the maximum value of the saturated magnetic field was 146 (Oe) in a temperature range of −20° C. to 60° C. The magnetic compensation temperature was −40° C..

Embodiment 4

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 6.4 g, gallium oxide ($Ga_2O_3$, 3N) of 35.0 g and aluminum oxide ($Al_2O_3$, 3N) of 4.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 773° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 µm, a lattice constant of 12.497±0.002 Å was brought into contact with the surface of the melt. While the temperature of the melt is maintained at 773° C., the epitaxial growth was performed for three hours to provide a bismuth-substituted rare earth iron garnet single crystal having a composition of $Gd_{0.85}Y_{0.86}Bi_{1.29}Fe_{4.00}Ga_{0.76}Al_{0.24}O_{12}$ and a thickness of 61 µm.

The dependency of the Faraday rotating angle on the external magnetic field was measured by the procedure in Embodiment 1. With the $Gd_{0.85}Y_{0.86}Bi_{1.29}Fe_{4.00}Ga_{0.76}Al_{0.24}O_{12}$ single crystal obtained in this embodiment, the maximum value of the saturated magnetic field was 135 (Oe) in a temperature range of −20° C. to 60° C. The magnetic compensation temperature was −36° C..

Embodiment 5

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, ytterbium oxide. ($Yb_2O_3$, 3N) of 10.9 g and gallium oxide ($Ga_2O_3$, 3N) of 28.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 755° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 µm, a lattice constant of 12.497±0.002 Å was brought into contact with the surface of the melt. While the temperature of the melt is maintained at 755° C., the epitaxial growth was performed for three hours to provide a bismuth-substituted rare earth iron garnet single crystal having a composition of $Gd_{0.76}Yb_{0.71}Bi_{1.53}Fe_{4.20}Ga_{0.80}O_{12}$ and a thickness of 73 µm.

The dependency of the Faraday rotating angle on the external magnetic field was measured by the procedure in Embodiment 1. With the $Gd_{0.76}Yb_{0.71}Bi_{1.53}Fe_{4.20}Ga_{0.80}O_{12}$ single crystal obtained in this embodiment, the maximum value of the saturated magnetic field was 142 (Oe) in a temperature range of −20° C. to 60° C.. The magnetic compensation temperature was −40° C. or lower.

Embodiment 6

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, lutetium oxide ($Lu_2O_3$, 3N) of 11.1 g and gallium oxide ($Ga_2O_3$, 3N) of 28.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 750° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 µm, a lattice constant of 12.497±0.002 Å was brought into contact with the surface of the melt. While the temperature of the melt is maintained at 750° C., the epitaxial growth was performed for three hours to provide a bismuth-substituted rare earth iron garnet single crystal having a composition of $Gd_{0.74}Lu_{0.71}Bi_{1.55}Fe_{4.22}Ga_{0.78}O_{12}$ and a thickness of 69 µm.

The dependency of the Faraday rotating angle on the external magnetic field was measured by the procedure in Embodiment 1. With the $Gd_{0.74}Lu_{0.71}Bi_{1.55}Fe_{4.22}Ga_{0.78}O_{12}$ single crystal obtained in this embodiment, the maximum value of the saturated magnetic field was 153 (Oe) in a temperature range of −20° C. to 60° C. The magnetic compensation temperature was −40° C. or lower.

Embodiment 7

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74 g, gadolinium oxide ($Gd_2O_3$, 3N) of 10.3 g, yttrium oxide ($Y_2O_3$, 3N) of 3.2 g, ytterbium oxide ($Yb_2O_3$, 3N) of 5.4 g and gallium oxide ($Ga_2O_3$, 3N) of 39.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 766° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 µm, a lattice constant of 12.497±0.002 Å was brought into contact with the surface of the melt. While the temperature of the melt is maintained at 766° C., the epitaxial growth was performed for three hours to provide a bismuth-substituted rare earth iron garnet single crystal having a composition of $Gd_{0.72}Y_{0.44}Yb_{0.39}Bi_{1.45}Fe_{3.98}Ga_{1.02}O_{12}$ and a thickness of 72 µm.

The dependency of the Faraday rotating angle on the external magnetic field was measured by the procedure in Embodiment 1. With the $Gd_{0.72}Y_{0.44}Yb_{0.39}Bi_{1.45}Fe_{3.978}Ga_{1.02}O_{12}$ single crystal obtained in this embodiment, the maximum value of the saturated magnetic field was 131 (Oe) in a temperature range of −20° C. to 60° C. The magnetic compensation was −40° C.

Comparative Example 1

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 15.0 g , yttrium oxide ($Y_2O_3$, 3N) of 4.3 g, and gallium oxide ($Ga_2O_3$, 3N) of 39.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 770° C. to grow a bismuth-substituted rare earth iron garnet single crystal.

According to the ordinary technique, the one side of a (111) garnet single crystal [$(GdCa)_3(GaMgZr)_5O_{12}$] substrate having a thickness of 480 µm, a lattice constant of 12.497±0.002 Å was brought into contact with the surface of the melt. While the temperature of the melt is maintained at 770° C., the epitaxial growth was performed for three hours to provide a bismuth-substituted rare earth iron garnet single crystal having a composition of $Gd_{1.22}Y_{0.58}Fe_{3.99}Ga_{1.01}O_{12}$ and a thickness of 72 µm.

The magnetic compensation temperature of the $Gd_{1.22}Y_{0.58}Bi_{1.20}Fe_{3.99}Ga_{1.01}O_{12}$ single crystal thus obtained was −24° C.

Comparative Example 2

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 8.3 g, and gallium oxide ($Ga_2O_3$, 3N) of 39.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 768° C. to grow a bismuth-substituted rare earth iron garnet single crystal.

According to the ordinary technique, the one side of a (111) garnet single crystal $[(GdCa)_3(GaMgZr)_5O_{12}]$ substrate having a thickness of 480 µm, a lattice constant of 12.497±0.002 -521 was brought into contact with the surface of the melt. While the temperature of the melt is maintained at 768° C., the epitaxial growth was performed for three hours to provide a bismuth-substituted rare earth iron garnet single crystal having a composition of $Gd_{0.64}Y_{0.93}Bi_{1.43}Fe_{3.95}Ga_{1.05}O_{12}$ and a thickness of 73 µm.

The $Gd_{0.64}Y_{0.93}Bi_{1.43}Fe_{3.95}Ga_{1.05}O_{12}$ single crystal thus obtained has the maximum value of the inverted magnetic field of 172 (Oe) in the temperature range of −20° C. to 60° C.

Comparative Example 3

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 6.4 g, and gallium oxide ($Ga_2O_3$, 3N) of 23.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 773° C. to grow a bismuth-substituted rare earth iron garnet single crystal.

According to the ordinary technique, the one side of a (111) garnet single crystal $[(GdCa)_3(GaMgZr)_5O_{12}]$ substrate having a thickness of 80 µm, a lattice constant of 12.497±0.002 Å was brought into contact with the surface of the melt. While the temperature of the melt is maintained at 773° C., the epitaxial growth was performed for three hours to provide a bismuth-substituted rare earth iron garnet single crystal having a composition of $Gd_{0.85}Y_{0.89}Bi_{1.26}Fe_{4.34}Ga_{0.66}O_{12}$ and a thickness of 70 µm.

The $Gd_{0.85}Y_{0.89}Bi_{1.26}Fe_{4.34}Ga_{0.66}O_{12}$ single crystal thus obtained has the maximum value of the inverted magnetic field of 179 (Oe) in the temperature range of −20° C. to 60° C.

Comparative Example 4

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 6.4 g, and gallium oxide ($Ga_2O_3$, 3N) of 50.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 759° C. to grow a bismuth-substituted rare earth iron garnet single crystal.

According to the ordinary technique, the one side of a (111) garnet single crystal $[(GdCa)_3(GaMgZr)_5O_{12}]$ substrate having a thickness of 480 µm, a lattice constant of 12.497±0.002 Å was brought into contact with the surface of the melt. While the temperature of the melt is maintained at 759° C., the epitaxial growth was performed for three hours to provide a bismuth-substituted rare earth iron garnet single crystal having a composition of $Gd_{0.79}Y_{0.78}Bi_{1.43}Fe_{3.71}Ga_{1.29}O_{12}$ and a thickness of 65 µm.

The $Gd_{0.79}Y_{0.78}Bi_{1.43}Fe_{3.71}Ga_{1.29}O_{12}$ crystal thus obtained has the maximum value of the inverted magnetic field of 185 (Oe) in the temperature range of −20° C. to 60° C..

Comparative Example 5

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 8.3 g, gallium oxide ($Ga_2O_3$, 3N) of 32 g and aluminum oxide ($Al_2O_3$, 3N) of 6.0 g have been prepared. It was set at a predetermined position of a precise longitudinal tubular electric furnace. These compounds were heated and molten at 1000° C., and sufficiently stirred to be mixed uniformly. Then, the melt thus obtained was cooled to 766° C. to grow a bismuth-substituted rare earth iron garnet single crystal.

According to the ordinary technique, the one side of a (111) garnet single crystal $[(GdCa)_3(GaMgZr)_5O_{12}]$ substrate having a thickness of 480 µm, a lattice constant of 12.497±0.002 Å was brought into contact with the surface of the melt. While the temperature of the melt is maintained at 766° C., the epitaxial growth was performed for three hours to provide a bismuth-substituted rare earth iron garnet single crystal having a composition of $Gd_{0.85}Y_{0.88}Bi_{1.27}Fe_{4.11}Ga_{0.64}Al_{0.24}O_{12}$ and a thickness of 60 µm.

The $Gd_{0.85}Y_{0.88}Bi_{1.27}Fe_{4.11}Ga_{0.64}Al_{0.24}O_{12}$ single crystal thus obtained has the maximum value of the inverted magnetic field of 177 (Oe) in the temperature range of −20° C. to 60° C.

Comparative Example 6

In a platinum crucible having a capacity of 1000 ml, lead oxide (PbO, 4N) of 1660 g, bismuth oxide ($Bi_2O_3$, 4N) of 1160 g, ferric oxide ($Fe_2O_3$, 4N) of 175 g, boron oxide ($B_2O_3$, 5N) of 74.0 g, gadolinium oxide ($Gd_2O_3$, 3N) of 10.3 g, yttrium oxide ($Y_2O_3$, 3N) of 10.3 g, holmium oxide ($Ho_2O_3$, 3N) of 8.4 g and gallium oxide ($Ga_2O_3$, 3N) of 39 g have been prepared. It was set at a predetermined position of a precise longitudinal tubular electric furnace. These compounds were heated and molten at 1000° C., and sufficiently stirred to be mixed uniformly. Then, the melt thus obtained was cooled to 756° C. to grow a bismuth-substituted rare earth iron garnet single crystal.

According to the ordinary technique, the one side of a (111) garnet single crystal $[(GdCa)_3(GaMgZr)_5O_{12}]$ substrate having a thickness of 480 µm, a lattice constant of 12.497±0.002 Å was brought into contact with the surface of the melt. While the temperature of the melt is maintained at 756° C., the epitaxial growth was performed for three hours to provide a bismuth-substituted rare earth iron garnet single crystal having a composition of $Gd_{0.97}Ho_{0.75}Bi_{1.28}Fe_{3.98}Ga_{1.02}O_{12}$ and a thickness of 75 µm.

The $Gd_{0.97}Ho_{0.75}Bi_{1.28}Fe_{3.98}Ga_{1.02}O_{12}$ single crystal thus obtained has the maximum value of the inverted magnetic field of 183 (Oe) in the temperature range of −20° C. to 60° C..

What is claimed is:

1. A bismuth-substituted rare earth iron garnet single crystal grown on a non-magnetic substrate having a lattice constant of 12.490 Å–12.510 Å by the liquid phase epitaxial method, and represented by a general equation:

$$Gd_xR_yBi_{3-x-y}Fe_{5-z-w}Ga_zAl_wO_{12}$$

where R denotes at least one element selected from the group consisting of yttrium (Y), ytterbium (Yb) and lutetium (Lu), and x, y, z and w are numerical values in the ranges $0.50 \leq y/x \leq 1.35$, $1.40 \leq x+y \leq 1.90$, $0.0 \leq w/z \leq 0.3$ and $0.7 \leq z+w \leq 1.25$.

2. A bismuth-substituted rare earth iron garnet single crystal grown on a non-magnetic substrate having a lattice constant of 12.490 Å–12.510 Å by the liquid phase epitaxial method, and represented by a general equation:

$$Gd_xY_yBi_{3-x-y}Fe_{5-z-w}Ga_zAl_wO_{12}$$

where x, y, z and w are numerical values in the ranges $0.50 \leq y/x \leq 1.35$, $1.40 \leq x+y \leq 1.90$, $0.0 \leq w/z \leq 0.3$ and $0.7 \leq z+w \leq 1.25$.

3. A bismuth-substituted rare earth iron garnet single crystal grown on a non-magnetic substrate having a lattice constant of 12.490 Å–12.510 Å by the liquid phase epitaxial method, and represented by a general equation:

$$Gd_xYb_yBi_{3-x-y}Fe_{5-z-w}Ga_zAl_wO_{12}$$

where x, y, z and w are numerical values in the ranges $0.50 \leq y/x \leq 1.35$, $1.40 \leq x+y \leq 1.90$, $0.0 \leq w/z \leq 0.3$ and $0.7 \leq z+w \leq 1.25$.

4. A bismuth-substituted rare earth iron garnet single crystal grown on a non-magnetic substrate having a lattice constant of 12.490 Å–12.510 Å by the liquid phase epitaxial method, and represented by a general equation:

$$Gd_xLu_yBi_{3-x-y}Fe_{5-z-w}Ga_zAl_wO_{12}$$

where x, y, z and w are numerical values in the ranges $0.50 \leq y/x \leq 1.35$, $1.40 \leq x+y \leq 1.90$, $0.0 \leq w/z \leq 0.3$ and $0.7 \leq z+w \leq 1.25$.

5. In a Faraday rotator containing a bismuth-substituted rare earth iron garnet single crystal, the improvement comprises the single crystal is that set forth in claim 1.

6. In a magneto-optic optical switch containing a bismuth-substituted rare earth iron garnet single crystal, the improvement comprises the single crystal is that set forth in claim 1.

7. A bismuth-substituted rare earth iron garnet single crystal according to claim 1, wherein it has a composition expressed by the chemical equation of $Gd_{0.81}Y_{0.81}Bi_{1.38}Fe_{4.00}Ga_{1.00}O_{12}$ and a thickness of 72 μm.

8. A bismuth-substituted rare earth iron garnet single crystal according to claim 1, wherein it has a composition expressed by the chemical equation of $Gd_{0.65}Y_{0.85}Bi_{1.50}Fe_{3.85}Ga_{1.15}O_{12}$ and a thickness of 82 μm.

9. A bismuth-substituted rare earth iron garnet single crystal according to claim 1, wherein it has a composition expressed by the chemical equation of $Gd_{1.17}Y_{0.67}Bi_{1.16}Fe_{4.24}Ga_{0.76}O_{12}$ and a thickness of 69 μm.

10. A bismuth-substituted rare earth iron garnet single crystal according to claim 1, wherein it has a composition expressed by the chemical equation of $Gd_{0.85}Y_{0.86}Bi_{1.29}Fe_{4.00}Ga_{0.76}Al_{0.24}O_{12}$ and a thickness of 61 μm.

11. A bismuth-substituted rare earth iron garnet single crystal according to claim 1, wherein it has a composition expressed by the chemical equation of $Gd_{0.76}Yb_{0.71}Bi_{1.53}Fe_{4.20}Ga_{0.80}O_{12}$ and a thickness of 73 μm.

12. A bismuth-substituted rare earth iron garnet single crystal according to claim 1, wherein it has a composition expressed by the chemical equation of $Gd_{0.74}Lu_{0.71}Bi_{1.55}Fe_{4.22}Ga_{0.78}O_{12}$ and a thickness of 69 μm.

13. A bismuth-substituted rare earth iron garnet single crystal according to claim 1, wherein it has composition expressed by the chemical equation of $Gd_{0.72}Y_{0.44}Yb_{0.39}Bi_{1.45}Fe_{3.98}Ga_{1.02}O_{12}$ and a thickness of 72 μ.

* * * * *